United States Patent
Sferlazzo (12)

(10) Patent No.: US 6,972,055 B2
(45) Date of Patent: Dec. 6, 2005

(54) CONTINUOUS FLOW DEPOSITION SYSTEM

(75) Inventor: Piero Sferlazzo, Marblehead, MA (US)

(73) Assignee: Finens Corporation, Marblehead, MA (US)

( * ) Notice: Subject to any disclaimer, the term of this patent is extended or adjusted under 35 U.S.C. 154(b) by 22 days.

(21) Appl. No.: 10/604,502

(22) Filed: Jul. 25, 2003

(65) Prior Publication Data
US 2004/0187784 A1 Sep. 30, 2004

Related U.S. Application Data

(60) Provisional application No. 60/320,065, filed on Mar. 28, 2003.

(51) Int. Cl.[7] .......................... C23C 16/00; C23F 1/00; B65G 49/007
(52) U.S. Cl. .................. 118/719; 118/733; 156/345.31; 156/345.32; 204/298.26; 414/939
(58) Field of Search ....................... 156/345.31, 345.32; 118/719; 414/939; 204/298.25

(56) References Cited

U.S. PATENT DOCUMENTS

| | | | |
|---|---|---|---|
| 4,058,430 A | 11/1977 | Suntola et al. ............... 156/611 |
| 4,976,969 A * | 12/1990 | Plamondon .............. 424/78.04 |
| 4,976,996 A | 12/1990 | Monkowski et al. | |
| 5,281,274 A * | 1/1994 | Yoder .......................... 118/697 |
| 5,302,209 A * | 4/1994 | Maeda et al. ................ 118/719 |
| 5,338,362 A | 8/1994 | Imahashi | |
| 5,527,731 A | 6/1996 | Yamamoto et al. | |
| 5,747,113 A * | 5/1998 | Tsai ........................ 427/255.5 |
| 6,139,695 A * | 10/2000 | Washburn et al. ..... 204/192.12 |
| 6,319,553 B1 * | 11/2001 | McInerney et al. ......... 427/250 |
| 6,458,416 B1 | 10/2002 | Derderian et al. ........... 427/301 |
| 6,503,330 B1 | 1/2003 | Sneh et al. ................. 118/715 |
| 6,541,353 B1 | 4/2003 | Sandhu et al. .............. 438/478 |
| 6,576,062 B2 | 6/2003 | Matsuse ...................... 118/719 |
| 2001/0007244 A1 * | 7/2001 | Matsuse ...................... 118/719 |
| 2002/0043216 A1 * | 4/2002 | Hwang et al. ........ 118/723 VE |
| 2002/0046705 A1 * | 4/2002 | Sandhu et al. .............. 118/719 |
| 2002/0066411 A1 * | 6/2002 | Chiang et al. .............. 118/724 |
| 2002/0100418 A1 | 8/2002 | Sandhu et al. | |
| 2002/0195056 A1 | 12/2002 | Sandhu et al. .............. 118/719 |

(Continued)

FOREIGN PATENT DOCUMENTS

DE 101 41 084 A1 11/2002

(Continued)

OTHER PUBLICATIONS

Martin, High K Gate Dielectrics, LETI Annual Research Review- HighK Gate Dielectrics, Jun. 15, 2001, pp. 1-16.

(Continued)

*Primary Examiner*—Parviz Hassanzadeh
*Assistant Examiner*—Karla Moore
(74) *Attorney, Agent, or Firm*—Kurt Rauschenbach; Rauschenbach Patent Law Group, LLC

(57) ABSTRACT

An atomic layer deposition system is described that includes a deposition chamber. A first and second reaction chamber are positioned in the deposition chamber and contain a first and a second reactant species, respectively. A monolayer of the first reactant species is deposited on a substrate passing through the first reaction chamber. A monolayer of the second reactant species is deposited on a substrate passing through the second reaction chamber. A transport mechanism transports a substrate in a path through the first reaction chamber and through the second reaction chamber, thereby depositing a film on the substrate by atomic layer deposition. The shape of the first and the second reaction chambers are chosen to achieve a constant exposure of the substrate to reactant species when the transport mechanism transports the substrate in the path through the respective reaction chambers at the constant transport rate.

32 Claims, 10 Drawing Sheets

U.S. PATENT DOCUMENTS

| | | | |
|---|---|---|---|
| 2003/0023338 A1 | 1/2003 | Chin et al. | 700/121 |
| 2003/0059538 A1 | 3/2003 | Chung et al. | |
| 2003/0098372 A1 | 5/2003 | Kim | 239/548 |
| 2003/0194493 A1* | 10/2003 | Chang et al. | 427/248.1 |
| 2004/0052972 A1 | 3/2004 | Schmitt | 427/569 |

FOREIGN PATENT DOCUMENTS

| | | | |
|---|---|---|---|
| EP | 06279182 | 10/1994 | |
| JP | 02082616 A * | 3/1990 | H01L 21/205 |
| WO | WO 01/17692 A1 | 3/2001 | |

OTHER PUBLICATIONS

Niinisto, Oxide Thin Films By ALD For Advanced Applications, Helsinki University of Technology, Espoo, Finland, Aug. 19th-24th, 2002.

Suntola, et al., Atomic Layer Epitaxy, Ann. Re. Mater. Sci., 1985, pp. 177-195, Annual Reviews Inc., Espoo, Finland.

* cited by examiner

CONTINUOUS FLOW DEPOSITION SYSTEM

CROSS REFERENCE TO RELATED APPLICATIONS

This patent application claims priority to U.S. provisional patent application Ser. No. 60/320,065, filed on Mar. 28, 2003, the entire disclosure of which is incorporated herein by reference.

BACKGROUND OF INVENTION

Chemical Vapor Deposition (CVD) is widely used to deposit dielectrics and metallic thin films. There are many techniques for performing CVD. For example, CVD can be preformed by introducing two or more precursor molecules in the gas phase (i.e., precursor gas A molecule and precursor gas B molecule) into a process chamber containing a substrate or work piece at pressures varying from less than $10^{-3}$ Torr to atmosphere.

The reaction of precursor gas molecule A and precursor gas molecule B at a surface of a substrate or work piece is activated or enhanced by adding energy. Energy can be added in many ways. For example, energy can be added by increasing the temperature at the surface and/or by exposing the surface to a plasma discharge or an ultraviolet (UV) radiation source. The product of the reaction is the desired film and some gaseous by-products, which are typically pumped away from the process chamber.

Most CVD reactions occur in the gaseous phase. The CVD reactions are strongly dependent on the spatial distribution of the precursor gas molecules. Non-uniform gas flow adjacent to the substrate can result in poor film uniformity and shadowing effects in three-dimensional features, such as vias, steps and other over-structures. The poor film uniformity and shadowing effects result in poor step coverage. In addition, some of the precursor molecules stick to a surface of the CVD chamber and react with other impinging molecules, thereby changing the spatial distribution of the precursor gases and, therefore, the uniformity of the deposited film.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
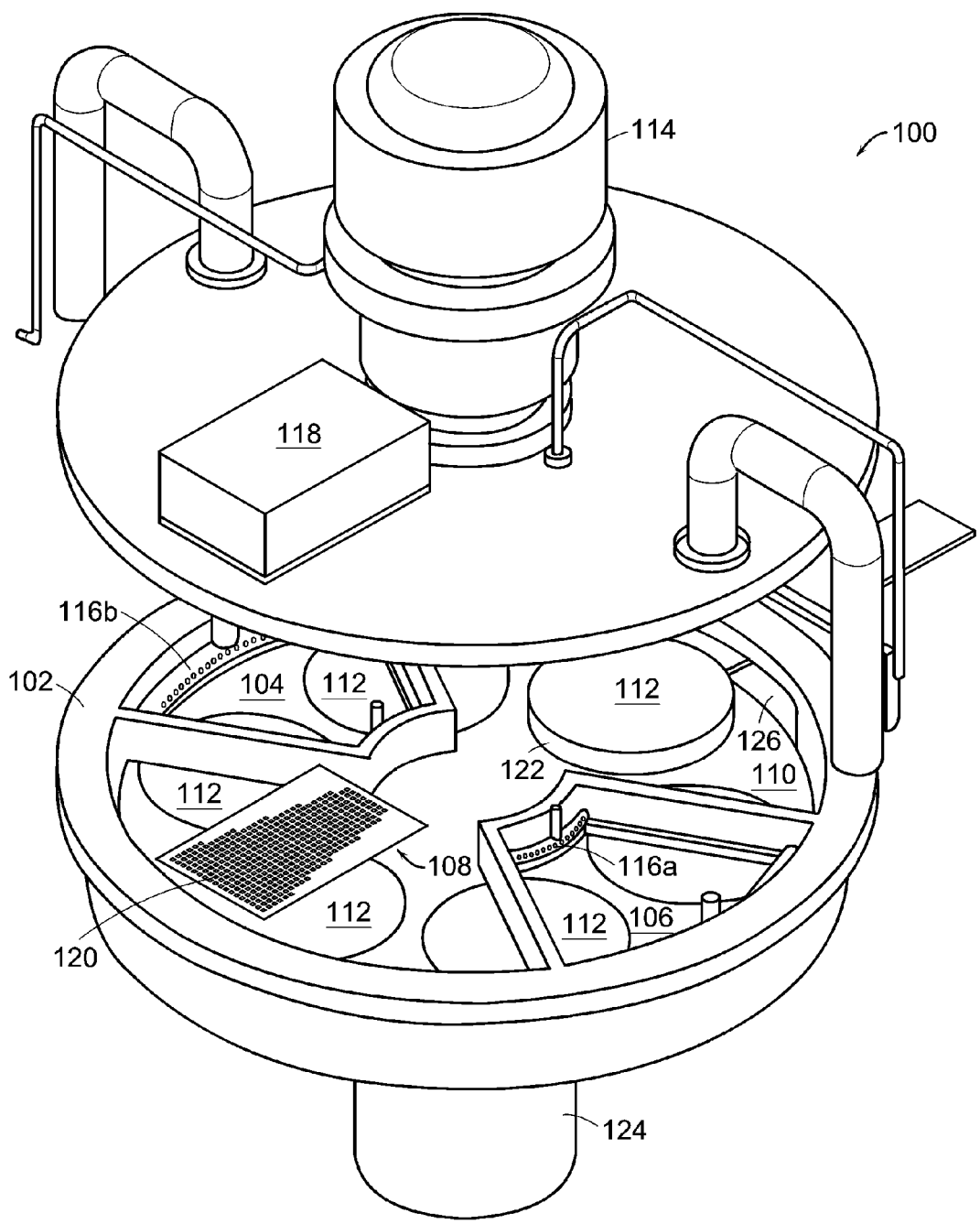
FIG. 1 illustrates a perspective view of an embodiment of an ALD system according the present invention.

Atomic Layer Deposition (ALD) is a variation of CVD that uses a self-limiting reaction. The term "self-limiting reaction" is defined herein to mean a reaction that limits itself in some way. For example, a self-limiting reaction can limit itself by terminating after a reactant is completely consumed by the reaction. One method of ALD sequentially injects a pulse of one type of precursor gas into a reaction chamber. After a predetermined time, another pulse of a different type of precursor gas is injected into the reaction chamber to form a monolayer of the desired material. This method is repeated until a film having the desired thickness is deposited onto the surface of the substrate.

For example, ALD can be performed by sequentially combining precursor gas A and precursor gas B in a process chamber. In a first step, a gas source injects a pulse of precursor gas A molecules into the process chamber. After a short exposure time, a monolayer of precursor gas A molecules deposits on the surface of the substrate. The process chamber is then purged with an inert gas.

During the first step, precursor gas A molecules stick to the surface of the substrate in a relatively uniform and conformal manner. The monolayer of precursor gas A molecules covers the exposed areas including vias, steps and surface structures in a relatively conformal manner with relatively high uniformity and minimal shadowing.

Process parameters, such as chamber pressure, surface temperature, gas injection time, and gas flow rate can be selected so that only one monolayer remains stable on the surface of the substrate at any given time. In addition, the process parameters can be selected for a particular sticking coefficient. Plasma pre-treatment can also be used to control the sticking coefficient.

In a second step, another gas source briefly injects precursor gas B molecules into the process chamber. A reaction between the injected precursor gas B molecules and the precursor gas A molecules that are stuck to the substrate surface occurs and that forms a monolayer of the desired film that is typically about 1–2 Angstroms thick. This reaction is self-limiting because the reaction terminates after all the precursor gas A molecules are consumed in the reaction. The process chamber is then purged with an inert gas.

The monolayer of the desired film covers the exposed areas including vias, steps and surface structures in a relatively conformal manner with relatively high uniformity and minimal shadowing. The precursor gas A and the precursor gas B molecules are then cycled sequentially until a film having the desired total film thickness is deposited on the substrate. Cycling the precursor gas A and the precursor gas B prevents reactions from occurring in the gaseous phase and generates a more controlled reaction.

Atomic Layer Deposition has been shown to be effective in producing relatively uniform, pinhole-free films having thickness that are only a few Angstroms thick. Dielectrics have been deposited using ALD that exhibit relatively high breakdown voltages and relatively high film integrity compared with other methods, such as PVD, thermal evaporation and CVD.

However, in practice, secondary effects, such as non-uniform flow distribution and residual cross-contamination, limit the achievable uniformity and integrity of films deposited by ALD. These secondary effects, although much less pronounced compared with known CVD methods, are significant limitations that prevent ALD from being useful for some applications.

There have been many attempts to improve the uniformity and integrity of ALD films with varying success. For example, researchers have developed new precursor gas chemistries, new techniques for surface pre-treatment, and new methods for injecting precursor gases at precise times in efforts to improve the uniformity and integrity of ALD films.

The ALD processing system according to the present invention eliminates non-uniformities and poor film integrity that are caused when the precursor gas sources are cycled by injection and purging in known ALD systems. The ALD system according to the present invention includes at least two spatially separated reaction chambers and a transport mechanism that transports substrates relative to the reaction chambers. The substrates can be transported relative to the reaction chambers in a continuous motion. Another transport mechanism can transport the reaction chambers relative to the substrates.

FIG. 1 illustrates a perspective view of an embodiment of an ALD system 100 according the present invention. The ALD system 100 includes a deposition chamber 102 that includes a first 104 and a second reaction chamber 106, a processing region 108, and a transport mechanism 110 that supports substrates 112 and transfers the substrates 112 relative to the first reaction chamber 104, the second reaction chamber 106, and the processing region 108.

A vacuum pump 114 is positioned in fluid communication with the deposition chamber 102. The vacuum pump 114 evacuates the deposition chamber 102 to the desired operating pressure. The vacuum pump 114 and the associated control system can also be used to control the pressure during processing and can purge the deposition chamber 102 of reactant gases and gas by-products during and after processing.

The first 104 and the second reaction chamber 106 are positioned inside of the deposition chamber 102 and are designed to contain a reactant and also to prevent that reactant species from escaping into other areas of the deposition chamber 102. There are numerous ways to seal the reaction chambers 104, 106 relative to the deposition chamber 102 to prevent reactants from escaping from the reaction chambers 104, 106 as described herein.

In practice, however, there may be some relatively small residual quantity of precursor gas molecules that escape from the reaction chambers 104, 106 or that remain on the surface of the substrates 112. The residual quantity of precursor gases is generally less than the quantity that is required to cause a significant reaction on the surface of the substrate 112.

The reaction chambers 104, 106 each include a gas injection manifold 116*a,b* that injects precursor gas molecules into the reaction chambers 104, 106. Numerous types of gas injection manifolds can be used. The shape of the gas injection manifold 116*a,b* can be chosen to provide a substantially constant flow of reactant species as the substrate passes through the reaction chambers 104, 106 at a particular rotation rate. The ALD system 100, however, does not require a gas injection system with precise control over the gas injection volume and time interval of injection that is commonly used in many other known ALD systems. Therefore, the ALD system 100 is relatively simple and inexpensive to manufacture.

In one embodiment, at least one of the reaction chambers 104, 106 includes a plasma generator that is used for plasma enhanced ALD processing. The plasma generator can be physically located in the reaction chambers 104, 106 so that it generates a plasma directly in the reaction chambers 104, 106. Alternatively, the plasma generator can be remotely located relative to the reaction chambers 104, 106 in a downstream configuration. In the downstream configuration, a plasma is generated by a remote plasma source that is physically located outside of the reaction chambers 104, 106 and then the plasma is directed into the reaction chambers 104, 106.

The processing region 108 is positioned inside the deposition chamber 102 and includes one or more apparatus 118 for performing at least one surface treatment or combination of surface treatments on the substrates 112 passing through the processing region 108. The apparatus 118 for performing the surface treatments on the substrates can be physically located inside the processing region 108 or can be remotely located relative to the processing region 108 as shown in FIG. 1. In one embodiment, the processing region 108 is shaped so as to causes a substantially constant exposure of the surface treatment performed on the substrates 112 passing through the processing region 108.

The apparatus 118 for performing the surface treatments in the processing region 108 can perform one or more types of surface treatments. For example, the apparatus 118 in the processing region 108 can be used to clean the surface of the substrates 112 passing through the processing region 108. The apparatus 118 in the processing region 108 can also be used to modify the sticking coefficient on the surface of the substrates 112 and/or to activate a reaction on the surface of the substrates 112. In addition, the apparatus 118 in the processing region 108 can be used to deposit a metallic, semiconductor, or dielectric film on the surface of the substrates 112.

In one embodiment, the apparatus 118 in the processing region 108 is a plasma generator. The plasma generator can be used to expose the substrates 112 passing through the processing region 108 to a plasma that performs a surface treatment on the substrates 112. For example, the plasma generator can be a magnetron plasma generator. Alternatively, the plasma generator can be a down-stream plasma generator, such as a down-stream microwave or ECR plasma source, that is remotely located relative to the processing region 108.

The plasma generated by the plasma generator can be used to clean the surface of the substrates 112 before ALD processing. In addition, the plasma generated by the plasma generator can be used to surface treat the substrates 112 between exposures of precursor gas molecules during ALD processing. In addition, the plasma generated by the plasma generator can be used to sputter metallic or dielectric material on the surface of the substrates 112.

In one embodiment, the apparatus 118 for performing surface treatments in the processing region 108 is an energy source. For example, the apparatus 118 for performing surface treatments can include at least one of an ion beam source, an electron beam source or an UV radiation source. The energy source can be positioned inside the processing region 108 or can be remotely located relative to the processing region 108 as shown in FIG. 1. In this embodiment, the processing region 108 is used to expose the substrates 112 to an energy source. The energy source can be used for many applications, such as activating a reaction on the surface of the substrate 112, removing by-product materials, and cleaning the surface of the substrates 112.

The energy source can include a distribution grid 120 to direct the energy to substrates 112 passing through the processing region 108. In one embodiment, the hole pattern in the distribution grid 120 is chosen so that the substrates 112 are exposed to a constant dose of energy as they pass through the processing region 108.

The transport mechanism 110 includes at least one substrate support 122 that supports the substrates 112 or work pieces during ALD processing. In one embodiment, the transport mechanism 110 is mechanically connected to a motor 124 that rotates the substrate support 122. The desired number of substrate supports 122 depends upon the desired throughput of the ALD system 100. A port 126 in the deposition chamber 102 provides access to inside the deposition chamber 102 so that the substrates 112 can be transported onto the substrate supports 122 for ALD processing and removed from the deposition chamber 102 after ALD processing.

In one embodiment, a transfer mechanism (not shown) positions the substrates 112 adjacent to the port 126 so that the substrates 112 can be easily transported to and from the substrate supports 122. In one embodiment (not shown), the port 126 is in fluid communication with another processing tool (not shown) so that substrates 112 can be transported to and from the other processing tool without exposing the substrates 112 to atmospheric pressure. For example, the deposition chamber 102 can be part of a cluster tool (not shown) in which the substrates 112 are transported to and from another process chamber in the cluster tool to and from the deposition chamber 102.

The transport mechanism 110 transports at least one substrate 112 relative to the first reaction chamber 104, the second reaction chamber 106, and the processing region 108. In one embodiment, the transport mechanism 110 transports the substrate supports 122 holding the substrates 112 while the first 104 and the second reaction chamber 106 remain in a fixed position. In this embodiment, the transport mechanism 110 transports the substrate supports 122 in a path through the first reaction chamber 104, through the second reaction chamber 106, and through the processing region 108 during ALD processing.

For example, the transport mechanism 110 can be a rotating member, such as a rotating disk, that is attached to the substrate supports 122 and the motor 124. The rotating member rotates the substrates 112 in the path through the first reaction chamber 104, through the second reaction chamber 106, and through the processing region 108. The rotating member transport mechanism 110 can provide a high-degree of deposition uniformity because of the rotational symmetry provided by the disk.

In another embodiment, the transport mechanism 110 transports the first reaction chamber 104, the second reaction chamber 106, and the processing region 108 relative to the substrates 112, while the substrates 112 remain in a fixed position. For example, in this embodiment, the reaction chambers 104, 106 and the processing region 108 are attached to a rotating member (not shown) that rotates the reaction chambers 104, 106 and the processing region 108 relative to the substrate supports 122.

In yet another embodiment, the transport mechanism 110 rotates the substrates 112, the reaction chambers 104, 106, and the processing region 108 relative to each other. For example, in this embodiment, the reaction chambers 104, 106 and the processing region 108 are attached to a first rotating member (not shown) and the substrate supports 122 are attached to a second rotating member (not shown).

Figure 2:
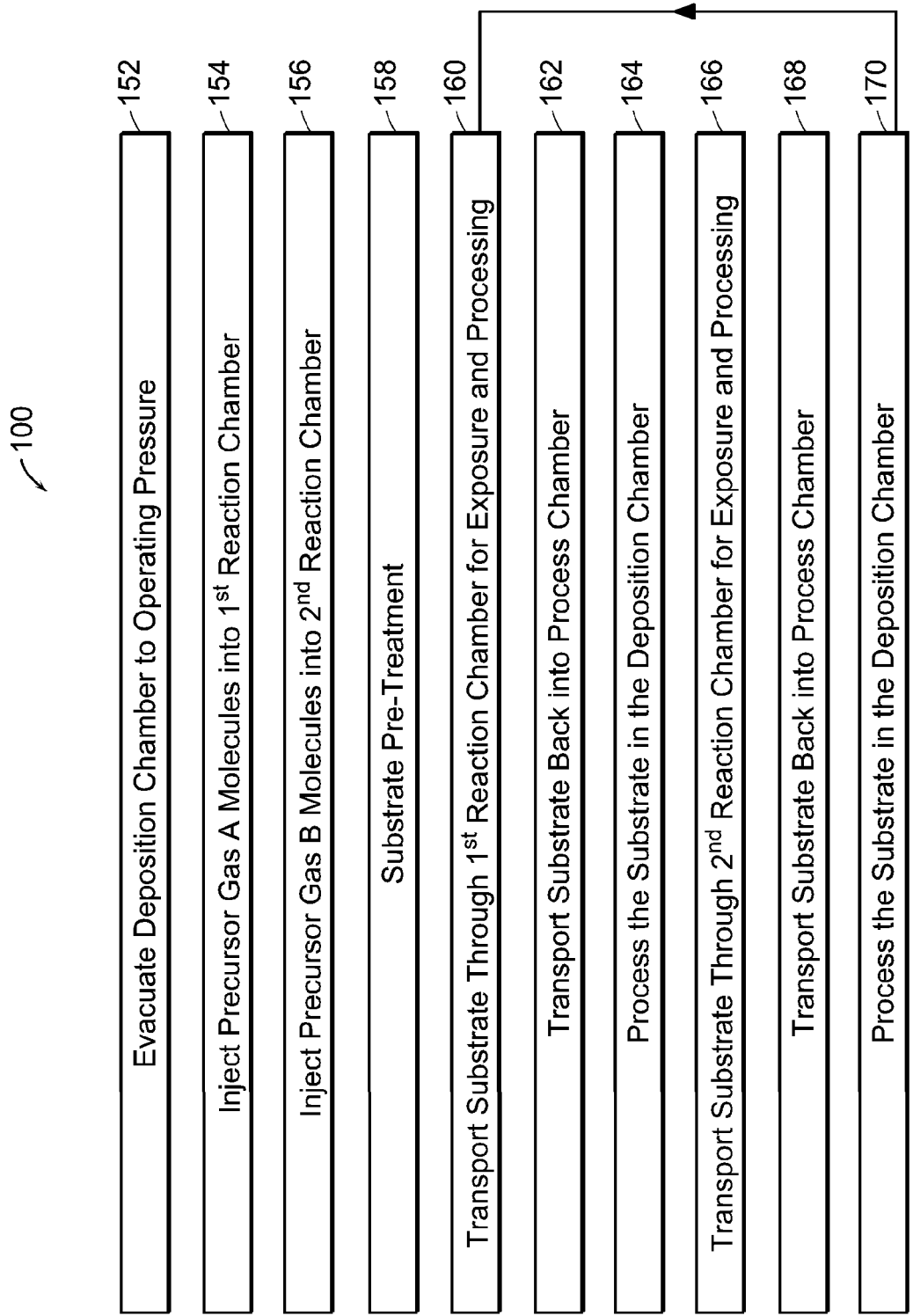
FIG. 2 illustrates a flow chart of a method of performing ALD according to the present invention for the ALD system described in connection with FIG. 1.

FIG. 2 illustrates a flow chart 150 of a method of performing ALD according to the present invention for the ALD system 100 described in connection with FIG. 1. The method is described in connection with the ALD system of FIG. 1 where the first 104 and the second reaction chamber 106 remain in a fixed position while the substrates 112 are transported through the reaction chambers 104, 106. However, other embodiments in which the substrates 112 and/or the reaction chambers 104, 106 are transported are within the scope of the present invention.

In a first step 152, the deposition chamber 102 is evacuated to the desired operating pressure by the vacuum pump 114. In a second step 154, precursor gas A molecules are injected into the first reaction chamber 104 to create the desired partial pressure of precursor gas A in the first reaction chamber 104. In some embodiments, precursor gas A and a second precursor gas are injected into the first reaction chamber 104. Also, in some embodiments, precursor gas A and a non-reactive gas are injected into the first reaction chamber 104. In one embodiment, the temperature of the first reaction chamber 104 is controlled to a temperature that promotes the desired reaction with the surface of the substrates 112 passing through the first reaction chamber 104.

In a third step 156, precursor gas B molecules are injected into the second reaction chamber 106 to create the desired partial pressure of precursor gas B. In some embodiments, precursor gas B and a second precursor gas are injected into the second reaction chamber 106. Also, in some embodiments, precursor gas B and a non-reactive gas are injected into the second reaction chamber 106. In one embodiment, the temperature of the second reaction chamber 106 is controlled to a temperature that promotes the desired reaction with the surface of the substrates 112 passing through the second reaction chamber 106. The second step 154 and the third step 156 can be performed in any order or can be performed simultaneously.

In one embodiment, a fourth step 158 is used to pre-treat a substrate 112 in the deposition chamber 102. For example, in the fourth step 158, the substrate can be exposed to a plasma or energy source, such as an ion beam, electron beam, or UV radiation source. The pre-treatment can clean the substrate 112 and/or control the sticking coefficient on the surface of the substrate 112. The fourth step 158 can be performed at any time during the process. For example, the fourth step 158 can also be performed directly after the deposition chamber 102 is evacuated to the desired operating pressure in the first step 152.

In a fifth step 160, the substrate 112 is transported from the deposition chamber 102 to the first reaction chamber 104. The substrate 112 is then transported through the first reaction chamber 104 to expose the substrate 112 to precursor gas A molecules. In some embodiments, the substrate 112 is processed while it is being transported through the first reaction chamber 104.

The transportation or rotation rate is chosen so that the substrate 112 remains in the first reaction chamber 104 for a first predetermined time that is sufficient to cause the desired exposure of the substrate 112 to the partial pressure of precursor gas A molecules in the first reaction chamber 104. In some embodiments, the first predetermined time is also chosen so that the substrate 112 has the desired exposure to the ALD processing. During the first predetermined time, precursor gas A molecules stick to the surface of the substrate 112 in a highly uniform and conformal manner and form a monolayer of precursor gas A molecules that covers every exposed area including vias, steps and surface structures.

In a sixth step 162, the substrate 112 containing the monolayer of precursor gas A molecules is transported out of the first reaction chamber 104 and back into the deposition chamber 102. In one embodiment, in a seventh step 164, the substrate 112 containing the monolayer of precursor gas A molecules are processed in the processing region 108 of the deposition chamber 102. For example, in one embodiment, the substrate 112 is exposed to a plasma, an energy source, or other type of surface treatment in the deposition chamber 102.

In an eighth step 166, the substrate 112 containing the monolayer of precursor gas A molecules is transported from the deposition chamber 102 to the second reaction chamber 106. The substrate 112 is then transported through the second reaction chamber 106 to expose the substrate 112 to precursor gas B molecules. In some embodiments, the substrate 112 is processed while it is being transported through the second reaction chamber 106.

The transportation or rotation rate is chosen so that the substrate 112 remains in the second reaction chamber 106 for a second predetermined time that is sufficient to cause the desired exposure of the substrate 112 to the partial pressure of precursor gas B molecules in the second reaction chamber 106. In some embodiments, the second predetermined time is also chosen so that the substrate 112 has the desired exposure to the ALD processing.

During the second predetermined time, precursor gas B molecules stick to the surface of the conformal coating of precursor gas A molecules. A reaction between the precursor gas B molecules and the precursor gas A molecules occurs. The reaction is self-limiting because the reaction terminates after all the precursor gas A molecules are consumed in the reaction. A monolayer of the desired film develops on the surface of the substrate 112 that is typically about 1–2 Angstroms thick. The monolayer covers all of the exposed areas, including vias, steps or surface structures, in a relatively uniform manner without any shadowing.

In a ninth step 168, the substrate 112 is transported out of the second reaction chamber 106 and back into the deposition chamber 102. In one embodiment, in a tenth step 170 the substrate 112 containing the monolayer of the desired film is processed in processing region 108 of the deposition chamber 102. For example, in one embodiment, the substrate 112 is exposed to a plasma, ion beam, electron beam or other type of surface treatment while in the processing region 108 of the deposition chamber 102. The substrate 112 remains in the deposition chamber 102 for a predetermined time interval.

The fifth step 160 through the tenth step 170 are then repeated until a film having the desired film thickness and film properties is deposited on the surface of the substrate 112. Thus, the substrate 112 is sequentially transported from the deposition chamber 102 to the first reaction chamber 104, back to the processing region 108 in the deposition chamber 102, to the second reaction chamber 106, and then back to the deposition chamber 102.

In one embodiment, the substrate 112 is rotated at a substantially continuous rotation rate from the deposition chamber 102 to the first reaction chamber 104, back to the processing region 108 of the deposition chamber 102, to the second reaction chamber 106, and then back to the deposition chamber 102. The time period that the substrate 112 is exposed to the precursor gas A molecules and the precursor gas B molecules in the first 104 and the second reaction chamber 106, respectively, is determined by the rotation rate of the substrate 112 within the deposition chamber 102. Also, the time periods that the substrate 112 is pretreated in the fourth step 158, and processed in the seventh 164 and the tenth step 170, is determined by the rotation rate of the substrate 112 within the deposition chamber 102.

Figure 3:
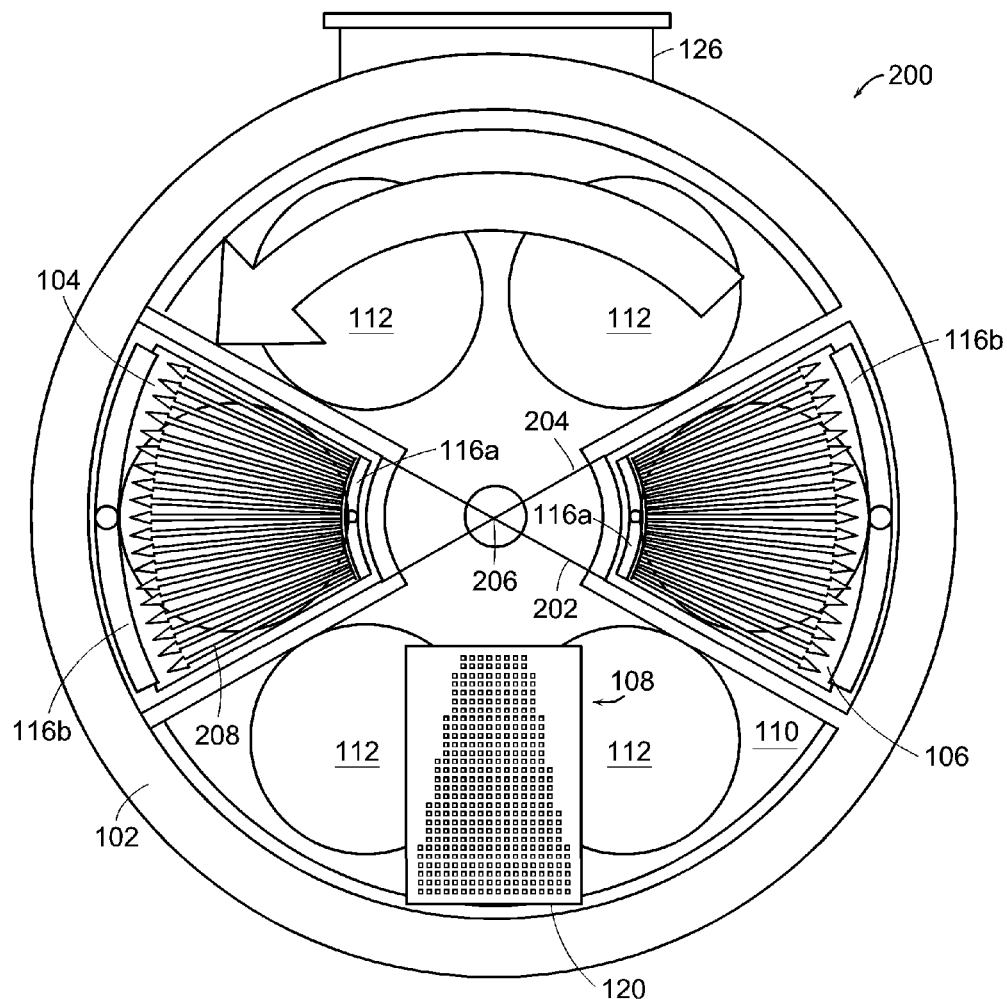
FIG. 3 illustrates a top view of the ALD system of FIG. 1 that shows a particular reaction chamber and gas injection manifold design according to the present invention.

There are many different configurations and embodiments of the reaction chambers 104, 106 and the gas injection manifolds 116*a,b* of the ALD system 100 according to the present invention. FIG. 3 illustrates a top view 200 of the ALD system of FIG. 1 that shows a particular reaction chamber and gas injection manifold design according to the present invention.

The reaction chambers 104, 106 shown in FIG. 3 are shaped and positioned to achieve a constant exposure of the substrates 112 to reactant species when the transport mechanism 110 transports the substrates 112 in the path through the reaction chambers 104, 106 at a constant rotation rate. In the embodiment shown, a first 202 and a second radial edge 204 of the first 104 and the second reaction chamber 106 are approximately aligned to a center 206 of the deposition chamber 102.

This design provides a constant exposure to substrates 112 passing through the reaction chambers 104, 106 by compensating for the radial dependence on the velocity of the substrates 112 rotating through the reaction chambers 104, 106. Providing a constant exposure can increase the throughput a deposition system because the predetermined exposure times can be minimized. Providing a constant exposure can even increase the throughput of ALD deposition systems having self-limiting reactions because achieving a constant exposure will eliminate the need to overexpose some areas of the substrates 112.

The top view 200 of the ALD system of FIG. 1 also shows the gas flow of a particular gas injection manifold design according to the present invention. The gas injection manifolds 116*a,b* inject precursor gas A into the first reaction chamber 104 and precursor gas B into the second reaction chamber 106. In the embodiment shown, the gas manifolds 116*a,b* are delta shaped. The delta shape is chosen so as to maintain a uniform gas flow over the reaction chambers 104, 106, while the substrates 112 are transported through the reaction chambers 104, 106 at a constant rotation rate. In one embodiment, the precursor gases flow from the center gas manifold section 116*a* to the outer gas manifold section 116*b* as shown by the arrows 208.

The top view 200 of the ALD system of FIG. 1 also shows the distribution grid 120 that is used to direct the energy to substrates 112 passing through the processing region 108. In the embodiment shown, the grid 120 defines apertures in a delta shaped pattern so as to expose substrates 112 rotating through the processing region 108 at a constant rotation rate to a constant dose of energy.

Figure 4A:
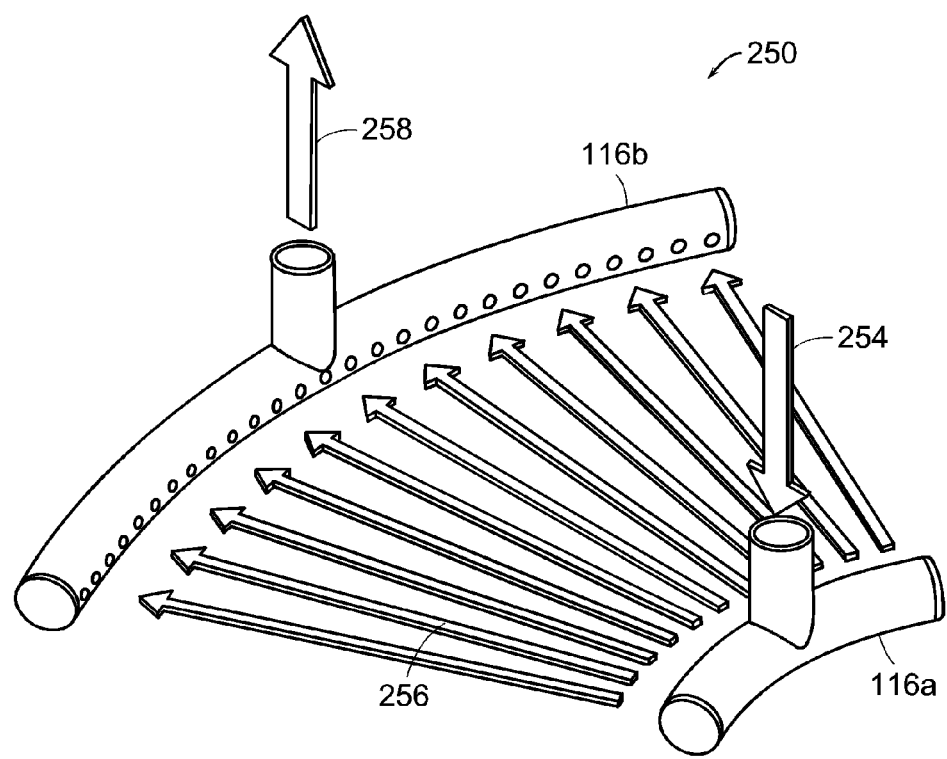
FIG. 4A,B illustrate two embodiments of a gas injection manifold for an ALD system according to the present invention.

FIG. 4A,B illustrate two embodiments of a gas injection manifold 250, 252 for an ALD system according to the present invention. FIG. 4A illustrates the gas injection manifold 116*a,b* that includes the center gas manifold section 116*a* and the outer gas manifold section 116*b* that were described in connection with FIG. 2. An input arrow 254 indicates the flow of precursor gases from a gas source (not shown) into the center gas manifold section 116a. A plurality of arrows 256 indicate the flow of precursor gas from the center gas manifold section 116a to the outer gas manifold section 202b. An output arrow 258 indicates the flow of precursor and by-product gases flowing from the reaction chambers 104, 106 to an exhaust gas system (not shown).

Figure 4B:
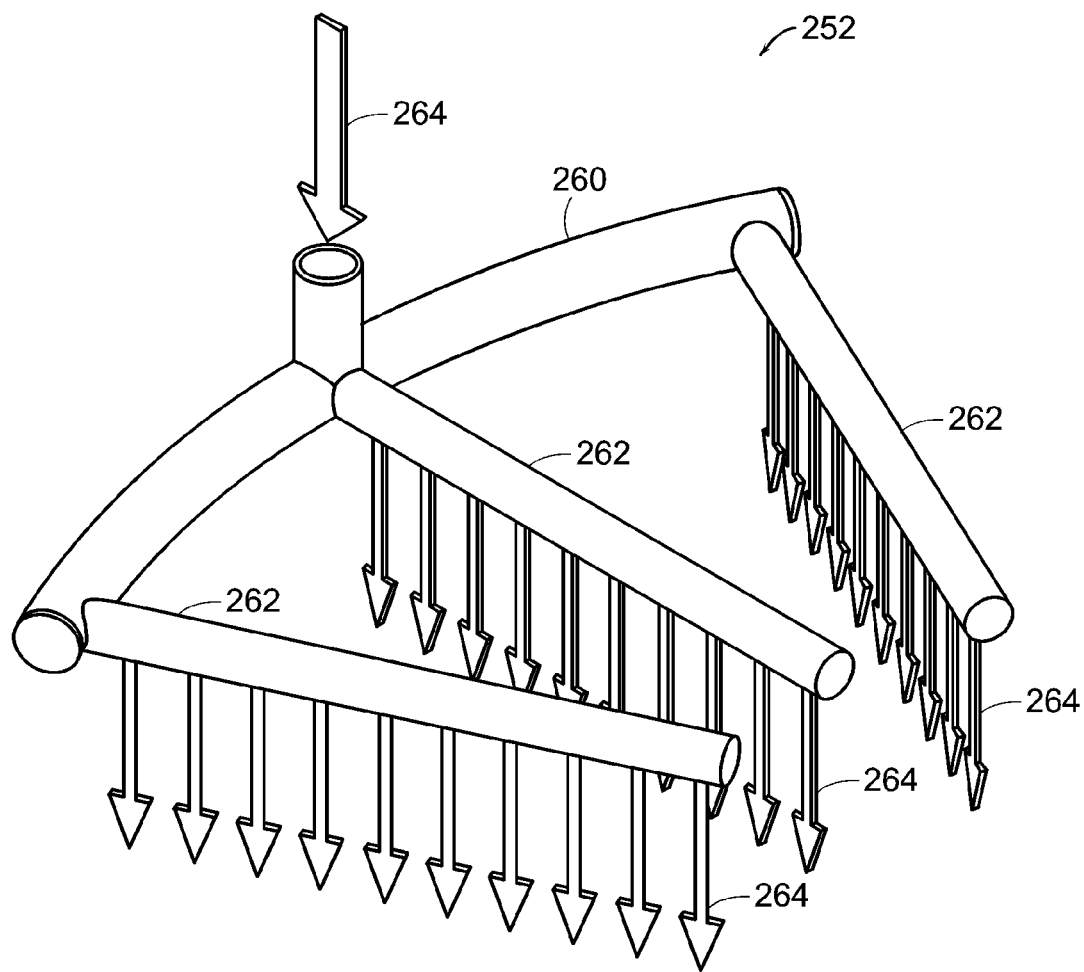

FIG. 4B illustrates another embodiment of a gas injection manifold 252 of an ALD system according to the present invention. The gas injection manifold 252 includes a main manifold section 260 and three gas distribution sections 262. An input arrow 264 indicates the flow of precursor gases from a gas source (not shown) into the main manifold section 260. A plurality of arrows 264 indicate the flow of precursor gas from the three gas distribution sections 262 into the reaction chambers 104, 106.

Figure 5:
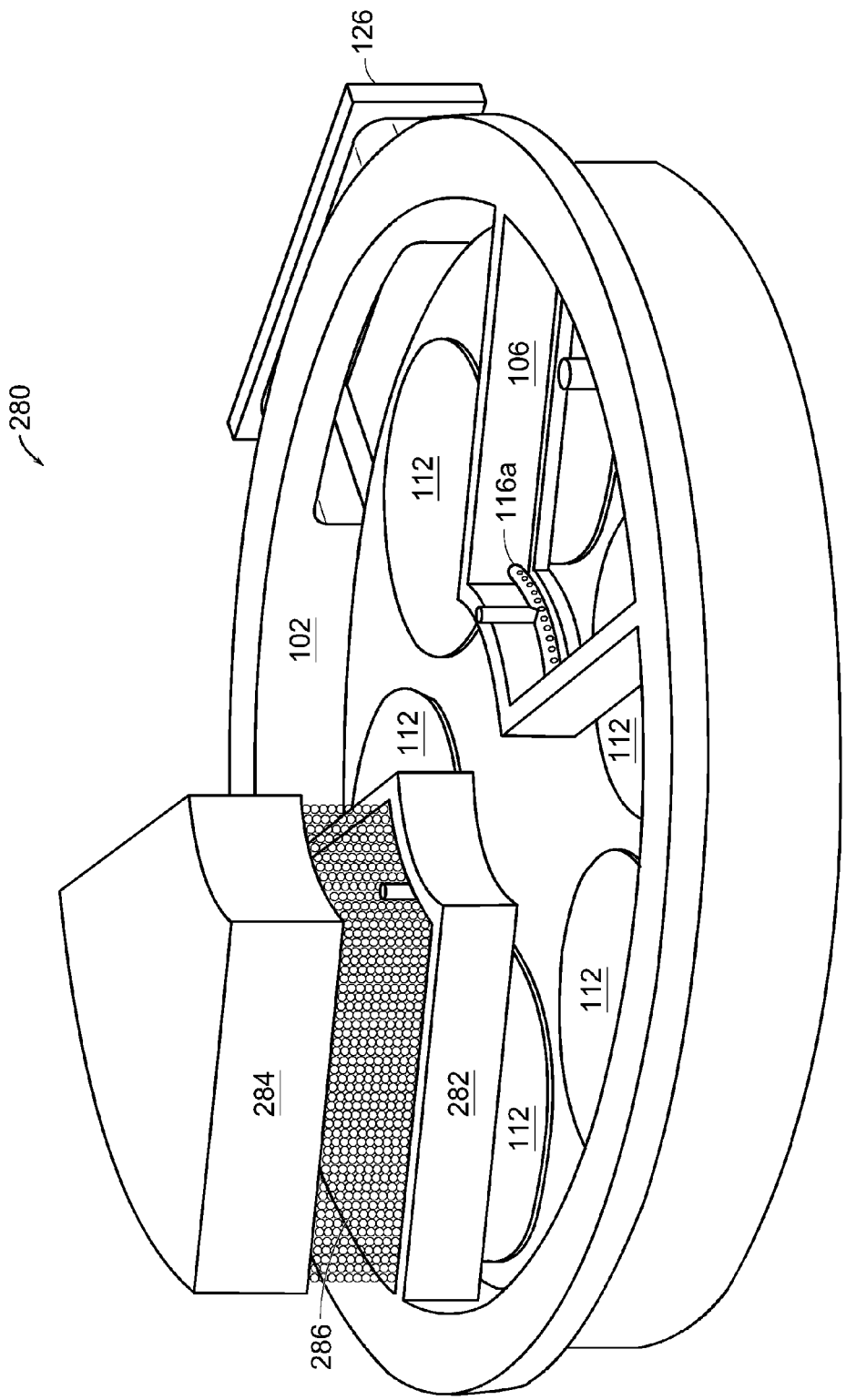
FIG. 5 illustrates a perspective view of an embodiment of an ALD system having a reaction chamber including a plasma generator that is used for plasma enhanced ALD processing.

FIG. 5 illustrates a perspective view of an embodiment of an ALD system 280 having a reaction chamber 282 including a plasma generator 284 that is used for plasma enhanced ALD processing. The ALD system 280 is similar to the ALD system 100 described in connection with FIG. 1. However, the ALD system 280 includes the reaction chamber 282 having the plasma generator 284. The plasma generator 284 generates a plasma 286 that is used for the plasma enhanced processing.

The plasma generator 284 can be physically located in the reaction chamber 282 as shown in FIG. 5 so that it generates the plasma 286 directly in the reaction chamber 282. Alternatively, the plasma generator 284 can be remotely located relative to the reaction chamber 282 in a downstream configuration. In the downstream configuration, the plasma 286 is generated by a remote plasma source (not shown) that is physically located outside of the reaction chamber 282 and then the plasma 286 is directed into the reaction chamber 282.

Figure 6:
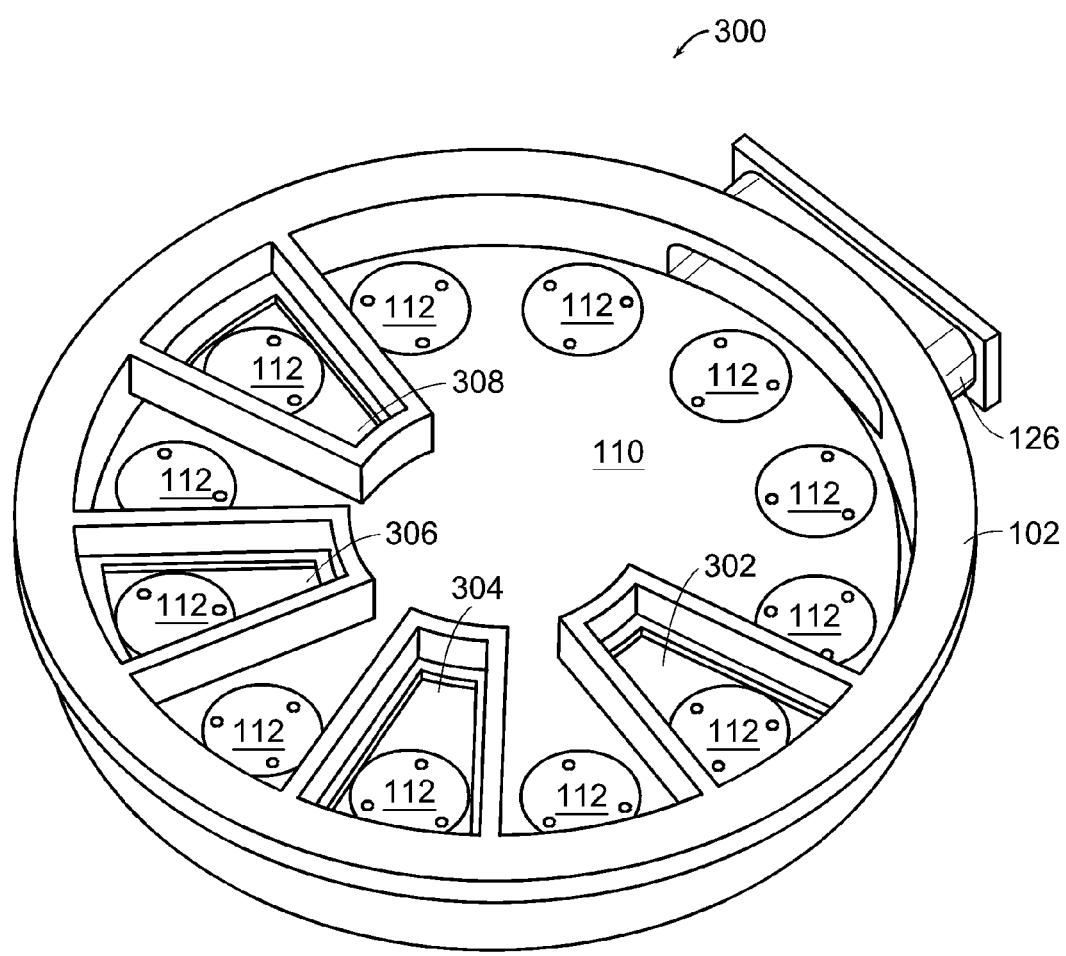
FIG. 6 illustrates a perspective view of an embodiment of an ALD system including a plurality of reaction chambers according the present invention.

FIG. 6 illustrates a perspective view of an embodiment of an ALD system 300 including a plurality of reaction chambers according the present invention. The deposition chamber 102 includes four reaction chambers: a first 302, second 304, third 306, and fourth reaction chamber 308. In other embodiments, the ALD system 300 includes additional reaction chambers (i.e. a fifth and sixth, etc.). The ALD system 300 also includes the processing region 108 that can include the apparatus 118 (FIG. 1) for performing surface treatments that is described herein. The transport mechanism 110 transfers the substrates 112 relative to the first 302, second 304, third 306, and fourth reaction chambers 308, and the processing region 108 (FIG. 3) as described herein.

In addition, the deposition chamber 102 includes a port 126 that provides access to inside the deposition chamber 102 so that the substrates 112 can be inserted for processing and removed after processing. In one embodiment, the ALD system 300 includes a transfer mechanism (not shown) that positions the substrates 112 adjacent to the port 126 so that the substrates 112 can be easily inserted and removed from the deposition chamber 102.

The third 306 and fourth reaction chamber 308 can contain the same precursor gases as the first 302 and the second reaction chamber 304 and can be used to increase the throughput. In this embodiment, one rotation of the substrates 112 deposits two monolayers of the desired film.

Alternatively, the third 306 and fourth reaction chamber 308 can contain different precursor gases that are used to deposit a different type of material on the substrates 112. For example, in this embodiment, the third 306 and the fourth reaction chamber 308 contain precursor gas C and precursor gas D, respectively, that are different from precursor gas A and precursor gas B.

Monolayers of two different types of material can be deposited in any desired sequence. A predetermined number of monolayers of one type of film can be deposited on the surface of a substrate 112 and then a predetermined number of monolayers of another type of film can be deposited on the surface of the substrate 112. Additional reaction chambers (i.e. a fifth and sixth, etc.) can be added to further increase the number of different types of monolayers that can be deposited on the surface of the substrate 112.

The ALD system 300 of the present invention has relatively high throughput and can be scaled to accommodate a relatively high volume of substrates because multiple substrates 112 can be simultaneously processed. For example, multiple substrates 112 can be processed simultaneously in the ALD system 300 by sequentially rotating substrates 112 in the deposition chamber 102 to the first reaction chamber 302, back to the deposition chamber 102, to the second reaction chamber 304, back to the deposition chamber 102, to the third reaction chamber 306, back to the deposition chamber 102, to the fourth reaction chamber 308, and then back to the deposition chamber 102.

Figure 7:
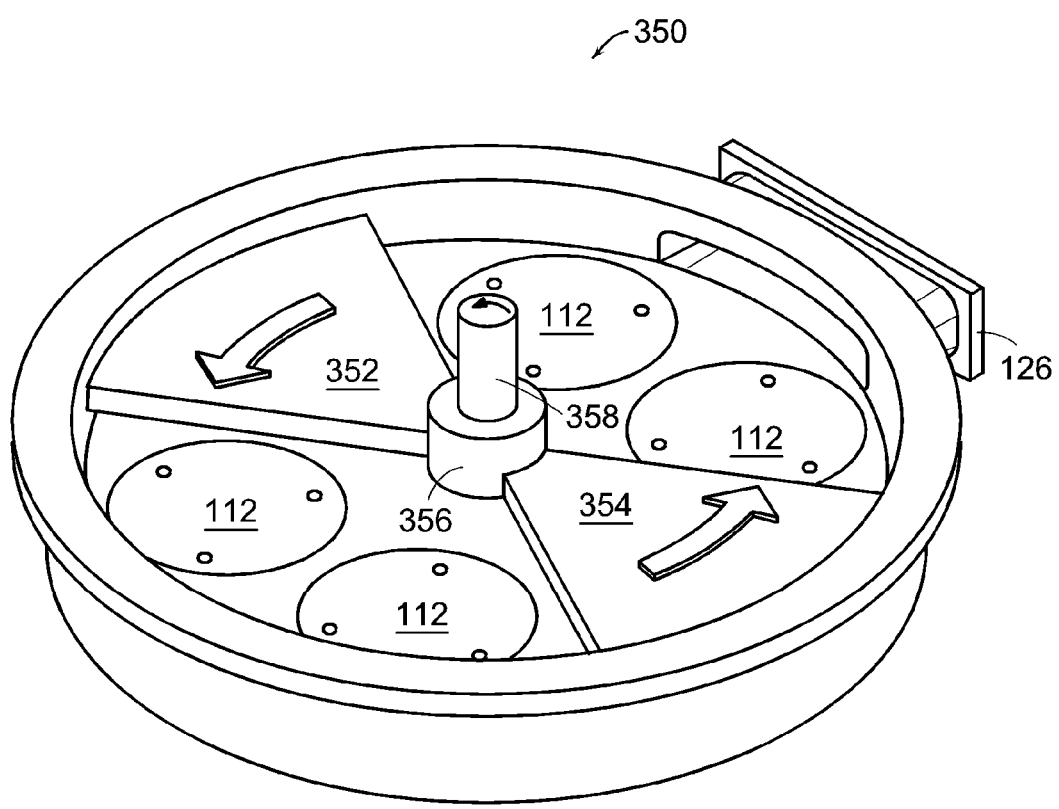
FIG. 7 illustrates a perspective view of an embodiment of an ALD system that includes reaction chambers that rotate relative to the substrates according the present invention.

FIG. 7 illustrates a perspective view of an embodiment of an ALD system 350 that includes reaction chambers 352, 354 that rotate relative to the substrates 112 according the present invention. The ALD system 350 includes a first 352 and a second reaction chamber 354 that rotate in the deposition chamber 102 so as to cause a relative motion between the substrates 112 and the reaction chambers 352, 354.

The reaction chambers 352, 354 are attached to a rotating member 356, which is rotated by a motor (not shown) that is mechanically coupled to a shaft 358. The rotation rate of the rotating member 356 can be precisely controlled. In one embodiment, the reaction chambers 352, 354 are rotated at a constant rotation rate relative to the substrates 112. In one embodiment, the substrates 112 are rotated relative to the reaction chambers 352, 354 to increase or decrease the relative motion between the substrates 112 and the reaction chambers 352, 354.

In another embodiment, the reaction chambers 352, 354 are attached to independent rotating members. For example, the reaction chambers 352, 354 can be attached to a first and a second rotating member, respectively. In one embodiment, the rotating members are gears that are mechanically coupled to the reaction chambers 352, 354. The first and the second rotating members are rotated so as to cause the desired relative motion between the substrates 112 and the reaction chambers 352, 354. The first and the second rotating members can be rotated in the same or in the opposite direction.

Figure 8A:
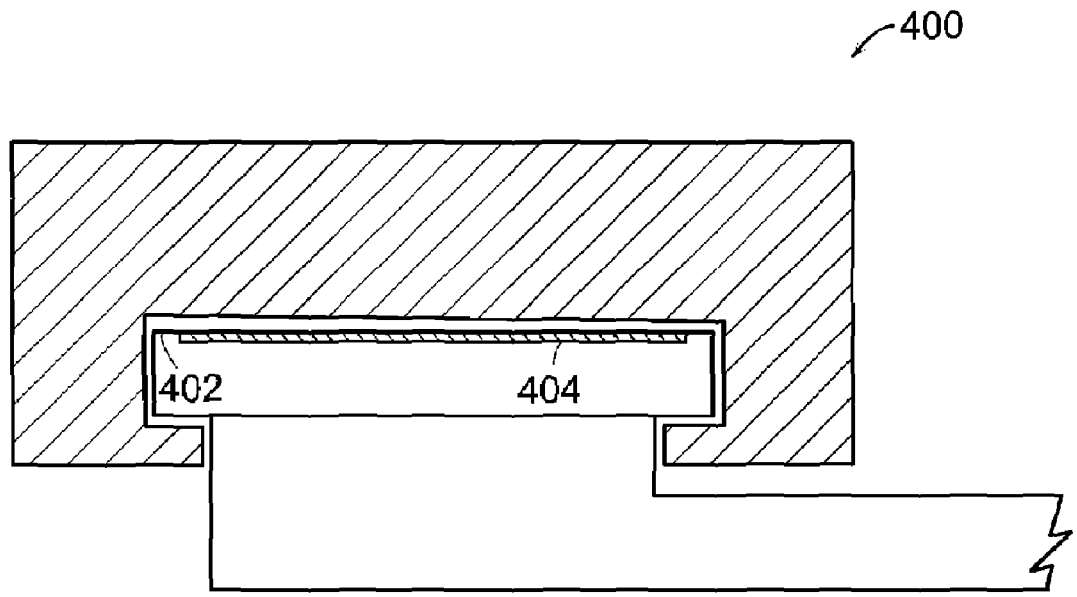
FIG. 8A,B illustrate two techniques of sealing the reaction chambers according to the present invention to prevent reactants from escaping from the reaction chambers.

FIG. 8A,B illustrate various methods of sealing the reaction chambers according to the present invention that prevent reactants from escaping from the reaction chambers. FIG. 8A illustrates a cross section 400 of an edge 402 of a reaction chamber according to the present invention having a sliding seal 404 that is used to prevent reactants from escaping from the reaction chamber. The sliding seal 404 causes a tight tolerance between the edge 402 of the reaction chamber and the deposition chamber 102 that can be in the range of approximately 10–40 mils. In one embodiment, a Teflon O-ring can be used as the sliding seal.

Figure 8B:
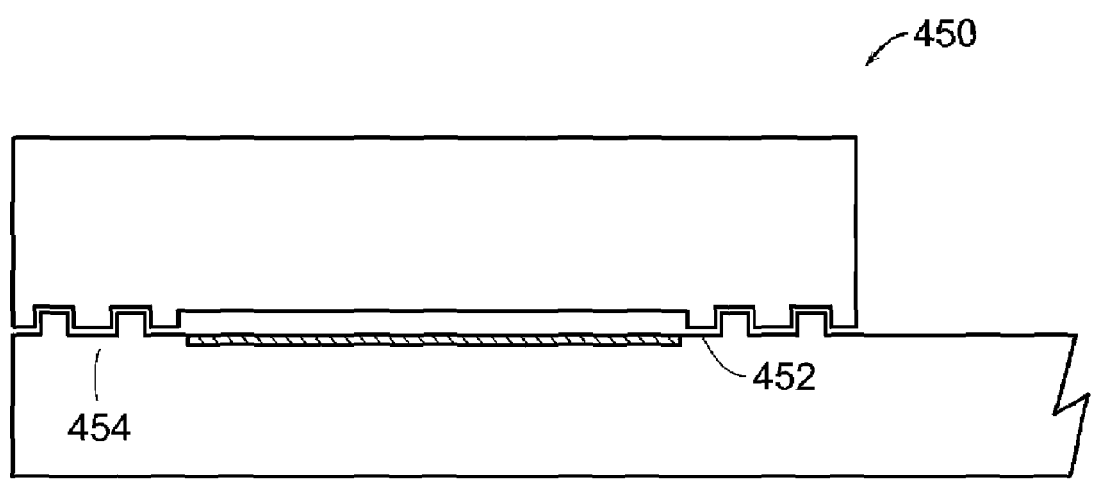

FIG. 8B illustrates a cross section 450 of an edge 452 of a reaction chamber according to the present invention having a corrugated seal 454 that is used to prevent reactants from escaping from the reaction chambers. The corrugated seal 454 maintains the pressure differential between the reaction chamber and the deposition chamber 102. In another embodiment, a gas curtain is used to seal the reaction chambers to prevent reactants from escaping from the reaction chambers.

Figure 9:
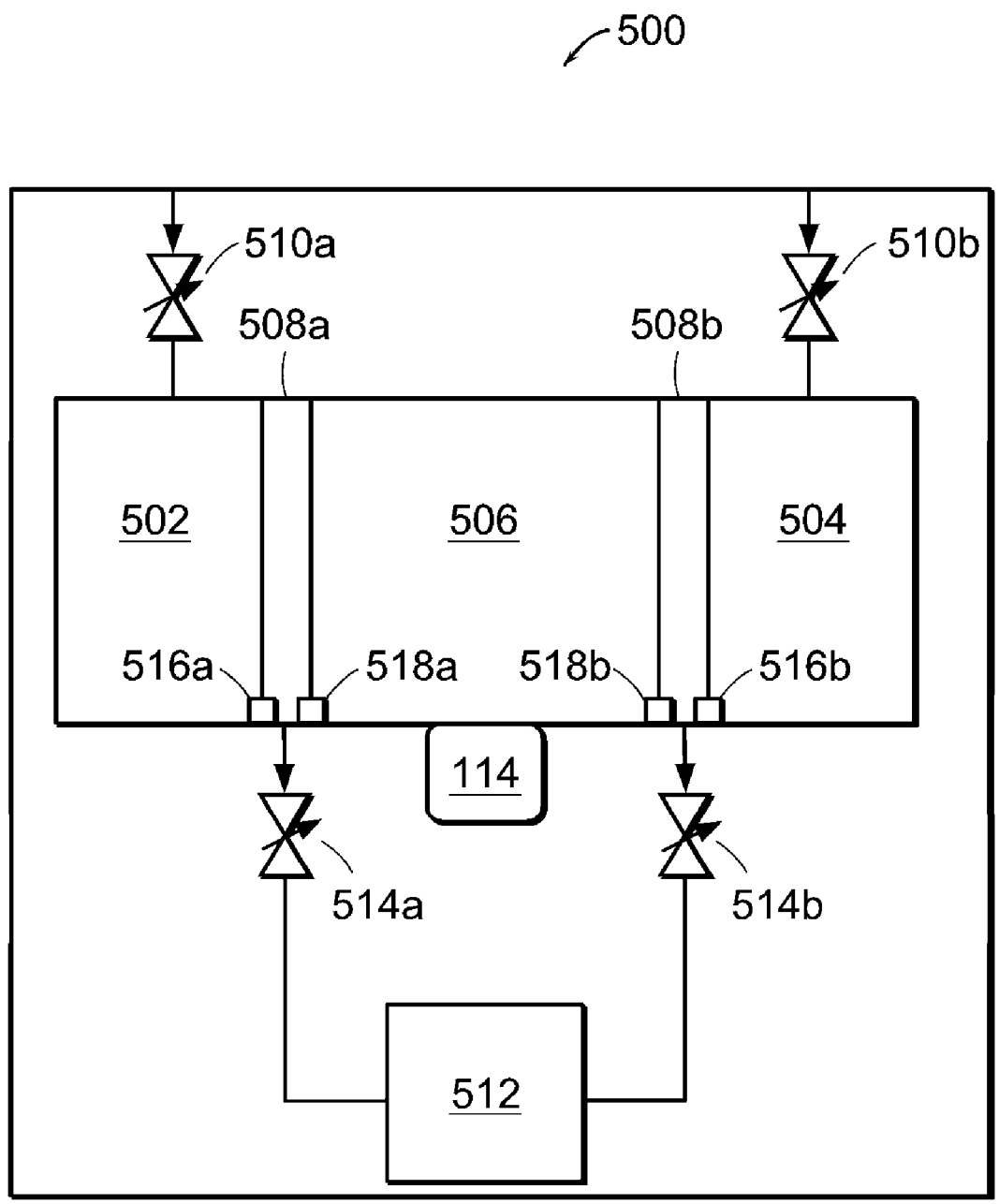
FIG. 9 illustrates a differentially pumped interface that can be used to seal the reaction chambers according to the present invention to prevent reactants from escaping from the reaction chambers.

FIG. 9 illustrates a differentially pumped interface 500 that can be used to seal the reaction chambers 104, 106 (FIG. 1) according to the present invention that prevents reactants from escaping from the reaction chambers 104, 106. The differentially pumped interface 500 illustrates four separate regions having different pressures. First 502 and second regions 504 correspond to the first 104 and the second reaction chambers 106, respectively. The third region 506 corresponds to the deposition chamber 102. The fourth regions 508a,b correspond to regions between the first 104 and the second reaction chamber 106, respectively, and the deposition chamber 102.

The differentially pumped interface 500 illustrates a first 510a and second gas flow controller 510b that control the flow rate of precursor gas A (with carrier gas) and precursor gas B (with carrier gas) into the first region 502 (first reaction chamber 104) and the second region 504 (second reaction chamber 106), respectively. In some embodiments, the first and second gas flow controllers 510a,b are adjusted so that the pressure in regions 502, 504 is in the 1–10 Torr range.

In one embodiment, the vacuum pump 114 is a molecular drag vacuum pump that maintains the third region 506 (deposition chamber 102) at a pressure that is in the $10^{-4}$ Torr range during deposition. A second vacuum pump 512 is coupled to the fourth regions 508a,b. In one embodiment, the second vacuum pump 512 is a dry backing pump.

In one embodiment, flow control valves 514a,b control the pumping speed in the fourth regions 508a,b, respectively. In some embodiments, the pumping speed at the interfaces 516a,b between the first and second regions 502, 504 and the fourth regions 508a,b, respectively, is on the order of eight liters/second. In some embodiments, the pumping speed at the interfaces 518a,b between the first and second regions 502, 504, respectively, and the third region 506 is on the order of 2 liters/second. In these embodiments, the pressure in the fourth regions 508a,b is in the $10^{-2}$ Torr range.

Equivalents

While the invention has been particularly shown and described with reference to specific embodiments, it should be understood by those skilled in the art that various changes in form and detail may be made therein without departing from the spirit and scope of the invention as defined herein.

What is claimed is:

1. An atomic layer deposition system comprising:
  a) a deposition chamber;
  b) a first reaction chamber being positioned in the deposition chamber, the first reaction chamber comprising solid walls that contain a first reactant species and a seal comprising at least one of a sliding seal and a corrugated seal that prevents the first reactant species from escaping, a monolayer of the first reactant species being deposited on a substrate passing through the first reaction chamber;
  c) a second reaction chamber being positioned in the deposition chamber, the second reaction chamber comprising solid walls that contain a second reactant species and a seal comprising at least one of a sliding seal and a corrugated seal that prevents the second reactant species from escaping, a monolayer of the second reactant species being deposited on a substrate passing through the second reaction chamber;
  d) a vacuum pump having an input that is in vacuum communication with a region between the first and the second reaction chambers, the vacuum pump reducing pressure inside the region between the first and the second reaction chambers to a pressure that is less than a pressure inside the first and the second reaction chamber; and
  e) a transprot mechanism that transports a substrate in a path through the first reaction chamber and through the second reaction chamber at a constant transport rate, thereby depositing a film on the substrate by atomic layer depositon.

2. The deposition system of claim 1 wherein a first and a second radial edge of at least one of the first and the second reaction chambers is aligned to a center of the deposition chamber.

3. The deposition system of claim 1 wherein at least one of the first and the second reaction chambers is formed in the shape of a trapezoid.

4. The deposition system of claim 1 further comprising a processing region that is positioned in the deposition chamber, a surface treatment being performed on a substrate passing through the processing region.

5. The deposition system of claim 1 wherein at least one of the first reaction chamber and the second reaction chamber comprises a plasma generator, the plasma generator generating a plasma in the at least one of the first and the second reaction chambers for plasma enhanced deposition.

6. The deposition system of claim 1 wherein at least one of the first reaction chamber and the second reaction chamber comprises a differentially pumped interface.

7. The deposition system of claim 1 wherein the first reaction chamber comprises a first gas injection manifold and the second reaction chamber comprises a second gas injection manifold, the first and the second gas injection manifolds providing a respective one of the first and second reactant species to the first and the second reaction chambers.

8. The deposition system of claim 1 wherein the first reaction chamber and the second reaction chamber transport relative to the substrate.

9. The deposition system of claim 1 wherein the region between the first and the second reaction chambers comprises an interface between the first and the second reaction chambers.

10. An atomic layer deposition system comprising:
  a) a deposition chamber;
  b) a first reaction chamber being positioned in the deposition chamber, the first reaction chamber comprising solid walls that contain a first reactant species and a seal comprising at least one of a sliding seal and a corrugated seal that prevents the first reactant species from escaping, a monolayer of the first reactant species being deposited on a substrate passing through the first reaction chamber;
  c) a second reaction chamber being positioned in the deposition chamber, the second reaction chamber comprising solid walls that contain a second reactant species and a seal comprising at least one of a sliding seal and a corrugated seal that prevents the second reactant species from escaping, a monolayer of the sceond reactant species being deposited on a substrate passing through the second reaction chamber;
  d) a vacuum pump having an input that is in vacuum communication with a region between the first and the second reaction chambers, the vacuum pump reducing pressure inside the region between the first and the second reaction chambers to a pressure that is less than a pressure inside the first and the second reaction chamber;

e) a processing region that is positioned in the deposition chamber, a surface treatment being performed on a substrate passing through the processing region; and f) a transport mechanism that transports a substrate in a path through the first reaction chamber, through the second reaction chamber, and through the processing region, thereby depositing a film on the substrate by atomic layer deposition.

11. The deposition system of claim 10 wherein a shape of at least one of the first and the second reaction chambers is chosen to achieve a constant exposure of the substrate to a respective one of the first and the second reactant species when the transport mechanism transports the substrate in the path through the respective one of the first and the second reaction chamber at a constant transport rate.

12. The deposition system of claim 10 wherein at least one of the first reaction chamber and the second reaction chamber comprises a plasma generator, the plasma generator generating a plasma in the at least one of the first and the second reaction region for plasma enhanced deposition.

13. The deposition system of claim 10 wherein at least one of the first reaction chamber and the second reaction chamber comprises a differentially pumped interface that maintains a partial pressure in the at least one of the first and the second reaction chambers.

14. The deposition system of claim 10 wherein the first reaction chamber comprises a first gas injection manifold and the second reaction chamber comprises a second gas injection manifold, the first and the second gas injection manifolds providing a respective one of the first and second reactant species to the first and the second reaction chambers.

15. The deposition system of claim 14 wherein a shape of a respective one of the first and the second gas injection manifolds is chosen to provide a substantially constant flow of reactant species as the substrate passes through a respective one of the first and the second reaction chambers.

16. The deposition system of claim 10 wherein the processing region is formed in a shape that causes a substantially constant exposure of the surface treatment being performed on the substrate passing through the processing region.

17. The deposition system of claim 10 further comprising a plasma generator that generates a plasma in the processing region, the substrate passing through the processing region being exposed to the plasma, thereby performing the surface treatment.

18. The deposition system of claim 17 wherein the plasma generator comprises a magnetron that sputters a metal layer on the substrate passing through the processing region.

19. The deposition system of claim 17 wherein the plasma generator comprises a downstream plasma generator that is remotely located relative to the deposition chamber.

20. The deposition system of claim 10 further comprising an ion gun that generates an ion beam in the processing region, the ion beam striking the substrate passing through the processing region, thereby performing the surface treatment.

21. The deposition system of claim 10 further comprising an electron gun that generates an electron beam in the processing region, the electron beam striking the substrate passing through the processing region, thereby performing the surface treatment.

22. The deposition system of claim 10 further comprising an UV radiation source that generates UV radiation in the processing region, the UV radiation striking the substrate passing through the processing region, thereby performing the surface treatment.

23. The deposition system of claim 10 further comprising a substrate support that supports the substrate as the transport mechanism transports the substrate in the path through the first reaction chamber, through the second reaction chamber, and through the processing region.

24. The deposition system of claim 10 wherein the first reaction chamber, the second reaction chamber, and the process chamber are transported relative to the substrate.

25. The deposition system of claim 10 further comprising a third and a fourth reaction chamber that are positioned in the deposition chamber.

26. The deposition system of claim 25 wherein the third reaction chamber contains the first reactant species and the fourth reaction chamber contains the second reactant species, a monolayer of the first reactant species being deposited on a substrate passing through the third reaction chamber and a monolayer of the second reactant species being deposited on a substrate passing through the fourth reaction chamber.

27. The deposition system of claim 25 wherein the third reaction chamber contains a third reactant species and the fourth reaction chamber contains a fourth reactant species, a monolayer of the third reactant species being deposited on a substrate passing through the third reaction chamber and a monolayer of the fourth reactant species being deposited on a substrate passing through the fourth reaction chamber.

28. The deposition system of claim 10 wherein the transport mechanism transports a substrate in the path at a substantially constant rate.

29. The deposition system of claim 10 further comprising a port for transporting a substrate into and out of the deposition chamber.

30. The deposition system of claim 10 wherein a pressure in the deposition chamber is chosen to direct reactant gas and by-product gases away from the first reaction chamber and the second reaction chamber.

31. The deposition system of claim 10 wherein the region between the first and the second reaction chambers comprises an interface between the first and the second reaction chambers.

32. An atomic layer deposition system comprising:

a) means for transporting a substrate through a first reaction chamber comprising solid walls that contain a first reactant species and a seal comprising at least one of a sliding seal and a corrugated seal that prevents the first reactant species from escaping, thereby forming a monolayer of the first reactant species on the substrate;

b) means for transporting a substrate through a second reaction chamber comprising solid walls that contain a second reactant species and a seal comprising at least one of a sliding seal and a corrugated seal that prevents the second reactant species from escaping, thereby forming a monolayer of the second reactant species on the substrate;

c) means for evacuating a region between the first and the second reaction chambers to a pressure that is less than a pressure inside the first and the second reaction chamber; and d) means for transporting a substrate through a processing region, thereby performing a surface treatment on the substrate.

* * * * *